(12) United States Patent
Zini et al.

(10) Patent No.: US 10,770,442 B2
(45) Date of Patent: Sep. 8, 2020

(54) DISPLAY DEVICE

(71) Applicant: OSRAM OLED GmbH, Regensburg (DE)

(72) Inventors: Lorenzo Zini, Regensburg (DE); Martin Rudolf Behringer, Regensburg (DE)

(73) Assignee: OSRAM OLED GMBH, Regensburg (DE)

(*) Notice: Subject to any disclaimer, the term of this patent is extended or adjusted under 35 U.S.C. 154(b) by 0 days.

(21) Appl. No.: 16/475,648

(22) PCT Filed: Jan. 8, 2018

(86) PCT No.: PCT/EP2018/050335
§ 371 (c)(1),
(2) Date: Jul. 2, 2019

(87) PCT Pub. No.: WO2018/134068
PCT Pub. Date: Jul. 26, 2018

(65) Prior Publication Data
US 2019/0371774 A1    Dec. 5, 2019

(30) Foreign Application Priority Data

Jan. 17, 2017 (DE) .......... 10 2017 100 798

(51) Int. Cl.
*H01L 25/16* (2006.01)
*H01L 33/50* (2010.01)
*H01L 33/58* (2010.01)
*H01L 27/15* (2006.01)
*H01L 25/075* (2006.01)

(52) U.S. Cl.
CPC ........ *H01L 25/167* (2013.01); *H01L 25/0753* (2013.01); *H01L 27/156* (2013.01); *H01L 33/502* (2013.01); *H01L 33/58* (2013.01)

(58) Field of Classification Search
CPC . H01L 25/167; H01L 27/156; H01L 27/1222; H01L 27/1274; H01L 25/0753; H01L 33/24; H01L 33/382; H01L 33/385; H01L 33/62; H01L 33/58; H01L 33/502
See application file for complete search history.

(56) References Cited

U.S. PATENT DOCUMENTS 8,625,058 B2   1/2014   Kozuma et al.
8,884,946 B2   11/2014  Niioka et al.
(Continued)

FOREIGN PATENT DOCUMENTS

CN   101483187 A   7/2009
CN   102867835 A   1/2013
(Continued)

*Primary Examiner* — Ahmed N Sefer
(74) *Attorney, Agent, or Firm* — Slater Matsil, LLP

(57) ABSTRACT

A display device is disclosed. In an embodiment a display device includes a carrier including a plurality of switches, a semiconductor layer sequence arranged on the carrier, the semiconductor layer sequence comprising an active region configured to generate primary radiation and forming a plurality of pixels, wherein each switch is configured to control at least one pixel and an optical element arranged on each pixel on a radiation exit surface of the semiconductor layer sequence facing away from the carrier.

18 Claims, 9 Drawing Sheets

(56) References Cited

U.S. PATENT DOCUMENTS

| | | |
|---|---|---|
| 8,963,066 B2 | 2/2015 | Sato et al. |
| 9,899,418 B2 | 2/2018 | Pfeuffer et al. |
| 10,304,811 B2 | 5/2019 | Zhang et al. |
| 2008/0175605 A1 | 7/2008 | Sakurai |
| 2013/0009039 A1* | 1/2013 | Sato ................. H01L 27/14623 250/208.1 |
| 2013/0048940 A1 | 2/2013 | Sills et al. |
| 2015/0014716 A1* | 1/2015 | von Malm ............ H01L 27/156 257/89 |
| 2015/0325598 A1* | 11/2015 | Pfeuffer ................ H01L 25/167 257/59 |
| 2016/0247855 A1 | 8/2016 | von Malm |
| 2017/0062674 A1* | 3/2017 | Kwon ..................... H01L 27/15 |
| 2017/0069611 A1* | 3/2017 | Zhang ................. H01L 25/0753 |

FOREIGN PATENT DOCUMENTS

| | | |
|---|---|---|
| DE | 102012112302 A1 | 6/2014 |
| TW | 201208083 A | 2/2012 |
| TW | 201305606 A | 2/2013 |
| TW | 201721833 A | 6/2017 |
| WO | 2013014979 A1 | 1/2013 |
| WO | 2016079505 A1 | 5/2016 |
| WO | 2017037529 A1 | 3/2017 |

* cited by examiner

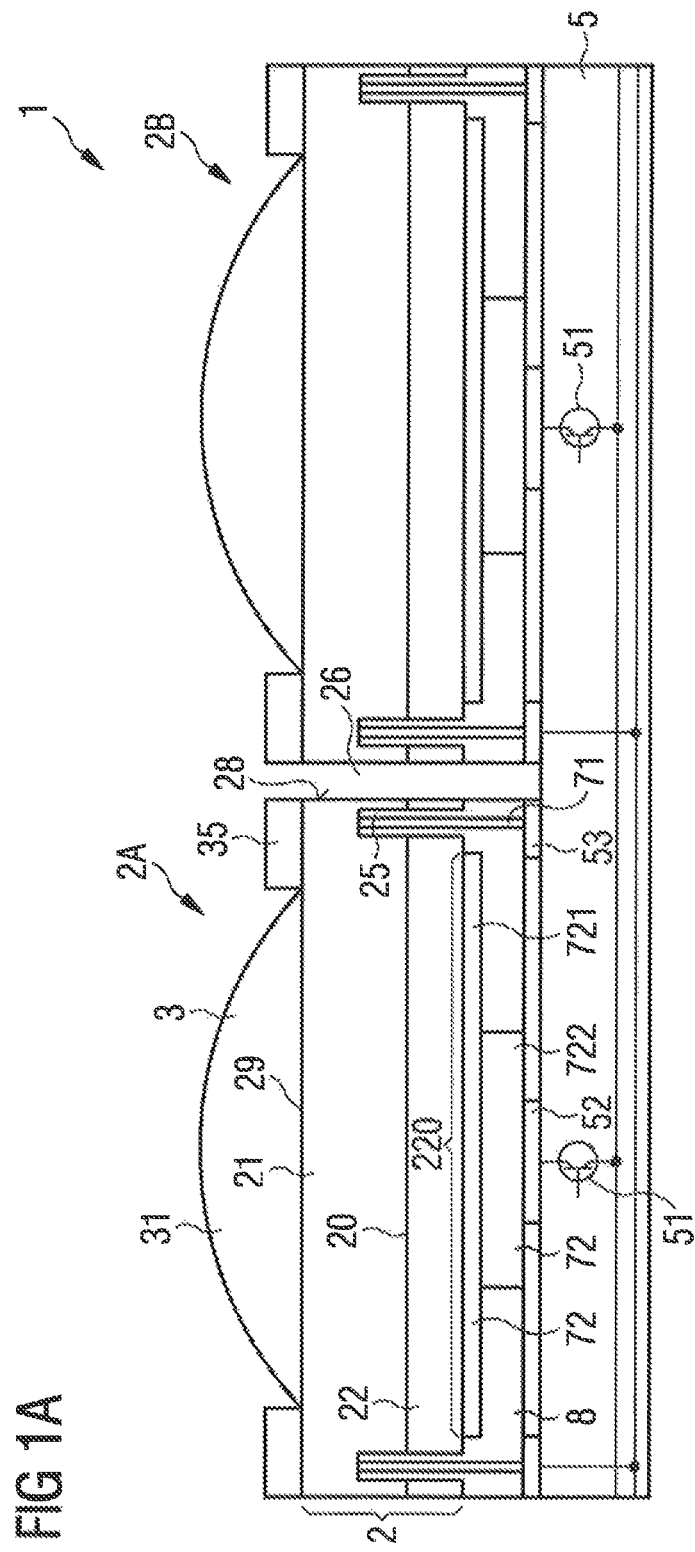

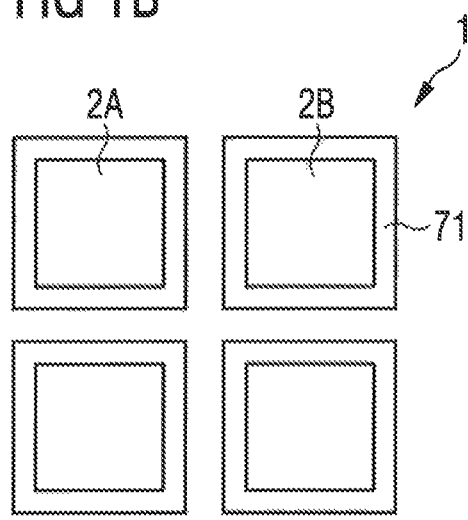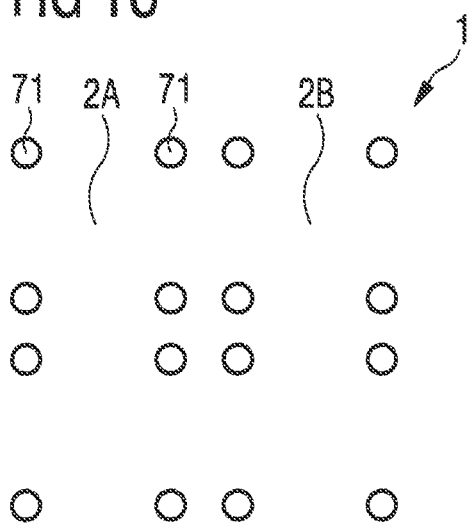

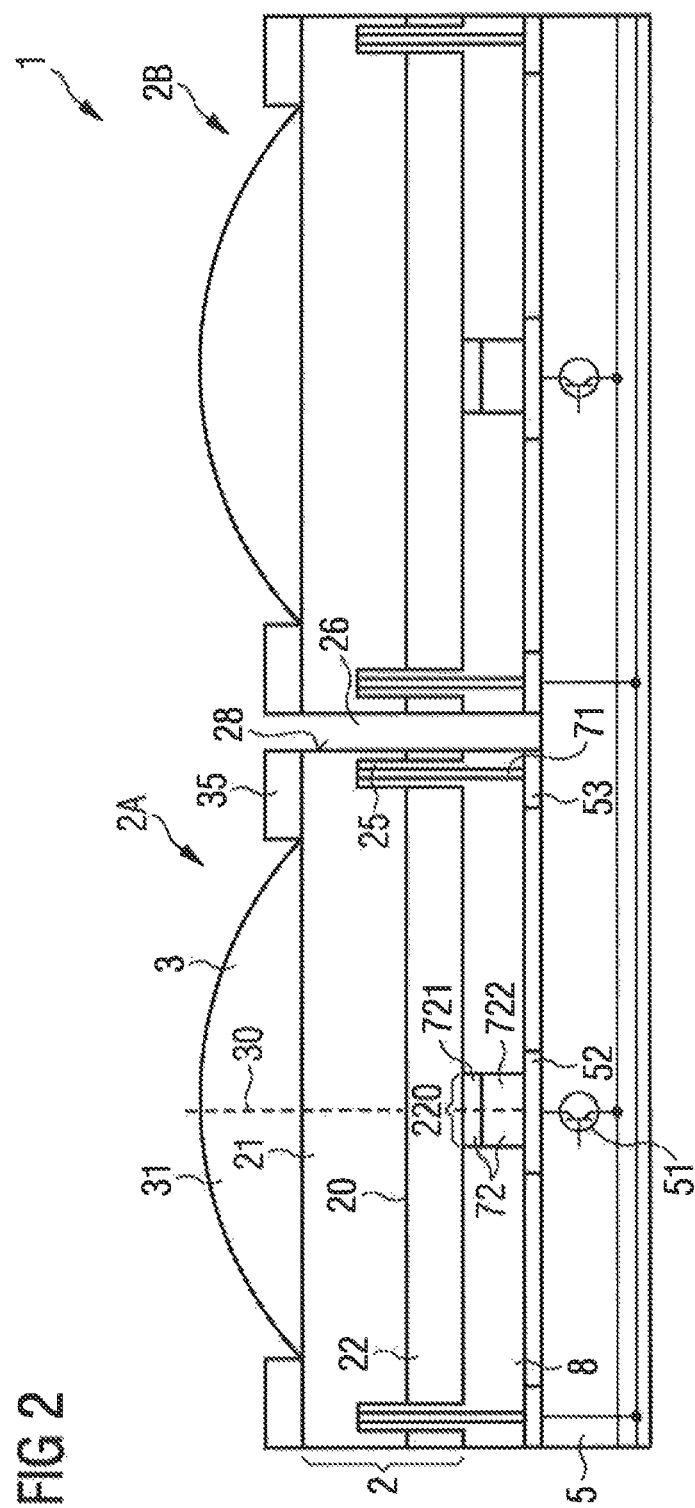

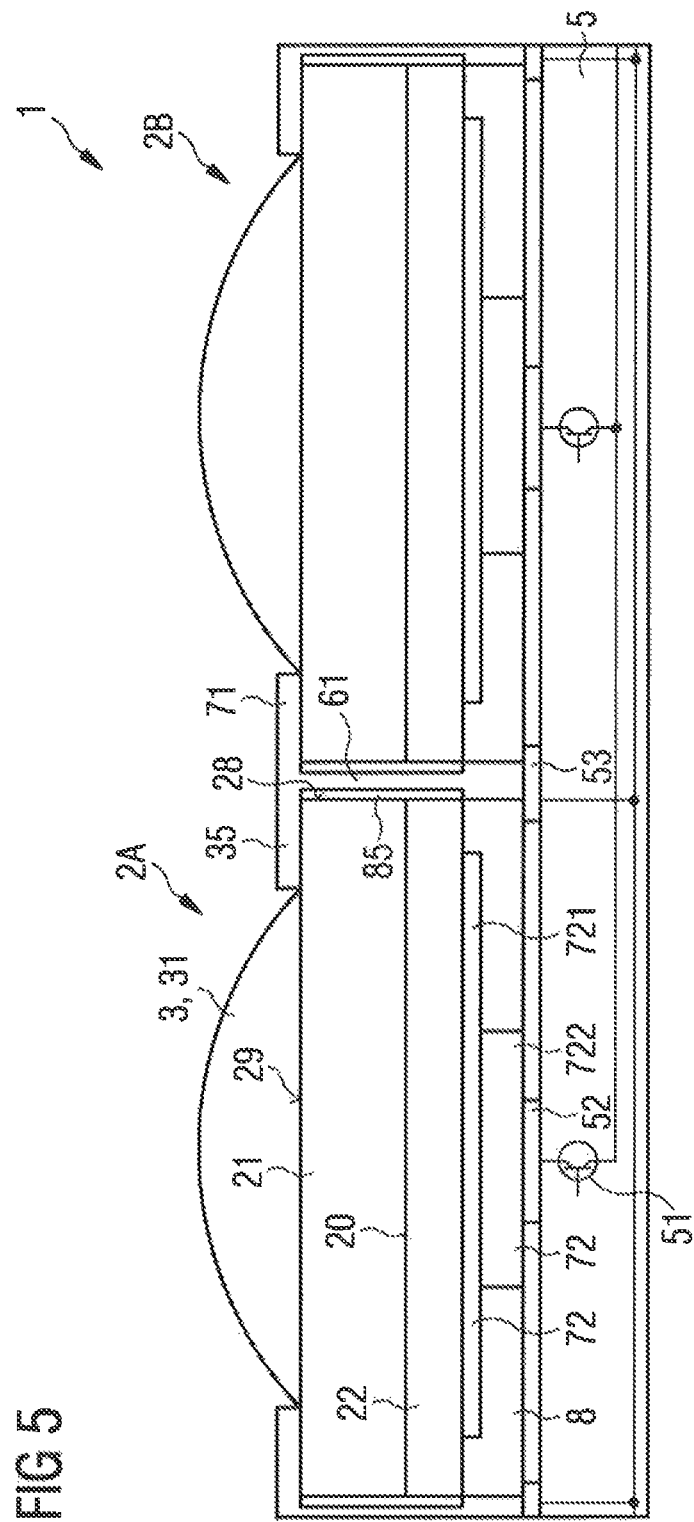

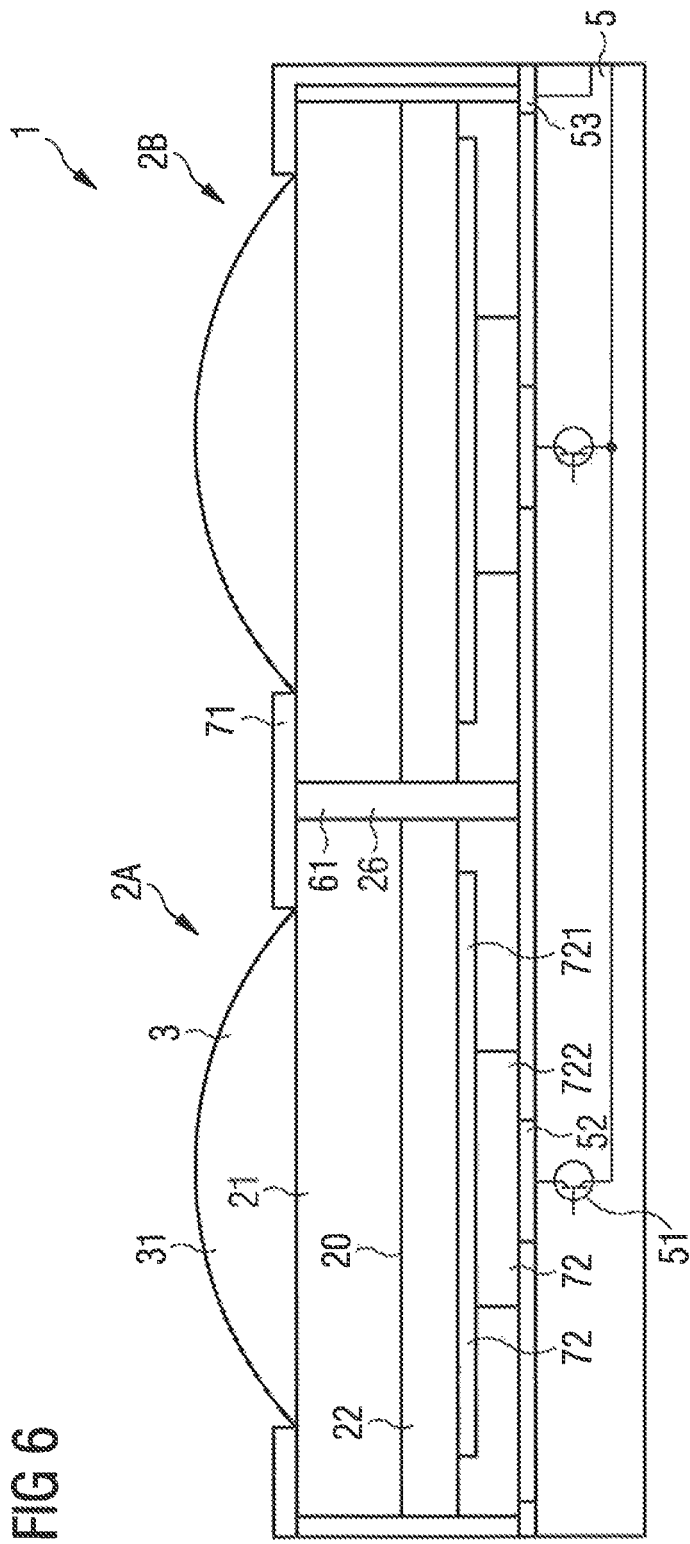

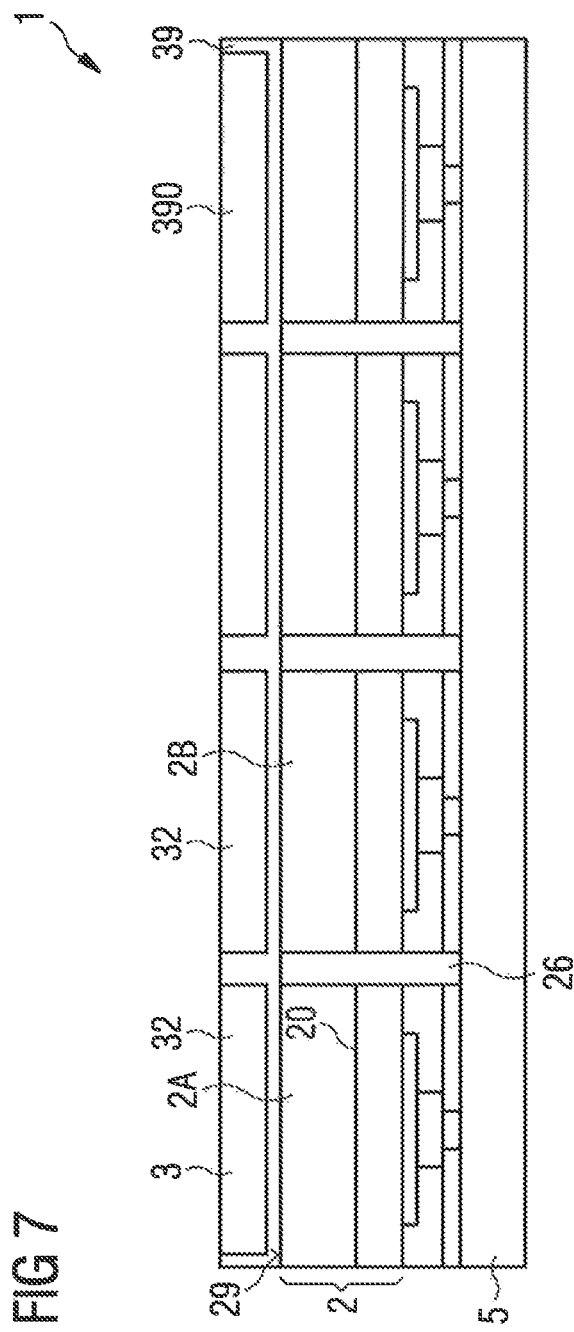

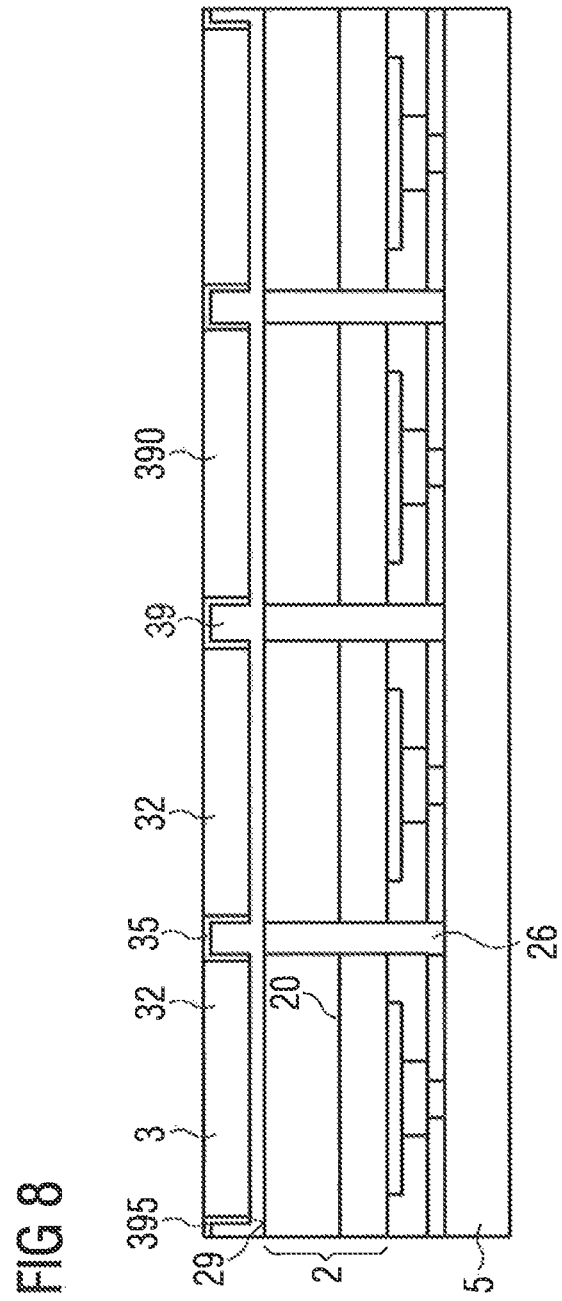

DISPLAY DEVICE

This patent application is a national phase filing under section 371 of PCT/EP2018/050335, filed Jan. 8, 2018, which claims the priority of German patent application 102017100798.9, filed Jan. 17, 2017, each of which is incorporated herein by reference in its entirety.

TECHNICAL FIELD

The present application relates to a display device.

BACKGROUND

Particularly in display devices where the individual pixels are close to each other, crosstalk of light from one pixel into the detection range of an adjacent pixel can lead to a reduction in contrast.

SUMMARY OF THE INVENTION

Embodiments provide a display device with which good contrast can be simply and reliably achieved.

A display device with a semiconductor layer sequence is specified. The term "display device" generally refers to a device emitting radiation during operation, in which individual pixels in particular can be controlled independently of one another. The radiation lies, for example, in the visible, infrared or ultraviolet spectral range.

For example, the display device is intended for a screen for displaying static or moving images, or for lighting with a variable radiation characteristic, for example, in an adaptive headlamp system.

According to at least one embodiment of the display device, the semiconductor layer sequence has an active region for generating radiation. The radiation to be generated may be incoherent or coherent. For example, the active region is disposed between a first semiconductor layer of a first conductivity type and a second semiconductor layer of a second charge type different from the first conductivity type, such that the active region is in a pn junction. In particular, the active region is part of a luminescent diode, such as a light-emitting diode (LED) or a vertical cavity surface-emitting laser (VCSEL). With a coherent emitter such as a surface emitter, directional radiation can be efficiently achieved.

According to at least one embodiment of the display device, the semiconductor layer sequence forms a plurality of pixels. The pixels are arranged side by side in lateral direction, i.e., along a main extension plane of the semiconductor layers of the semiconductor layer sequence. During the manufacturing of the display device, the pixels in particular result from a common semiconductor layer sequence, so that the semiconductor layers of the individual pixels do not differ in terms of their material composition and their layer thickness, or at least only differ in terms of production-related fluctuations which occur in lateral direction during the deposition of the semiconductor layer sequence. In top view of the display device the pixels may, for example, have a polygonal basic shape, such as triangular, quadrangular, approximately rectangular or square, or hexagonal. Each pixel can have a luminescent diode, such as an LED or a VCSEL.

According to at least one embodiment of the display device, the display device comprises a carrier on which the semiconductor layer sequence is arranged. The carrier serves in particular for the mechanical stabilization of the semiconductor layer sequence. In particular, the carrier is different from a growth substrate for the semiconductor layer sequence of the display device. Therefore, the carrier is not the growth substrate. However, the carrier can have the same material or be made of the same material as the growth substrate. The growth substrate for the in particular epitaxial deposition of the semiconductor layer sequence is no longer required in the display device and can be removed.

According to at least one embodiment of the display device, the carrier comprises a plurality of switches, each provided for controlling at least one pixel. For example, the first semiconductor layers or the second semiconductor layers of each pixel are connected to one of the switches. The respective other semiconductor layer can be electrically contacted with the corresponding other semiconductor layers of the adjacent pixels. During operation, these semiconductor layers can be on a common electrical potential.

The individual pixels can be controlled independently of each other by means of the switches. For example, the switches are configured in the form of transistors. The switches can in particular be integrated into the carrier. For example, the switches are configured using CMOS technology.

Advantageously the display device comprises a radiation exit surface of the semiconductor layer sequence on a side facing away from the carrier. Radiation generated during operation of the display device in the active region can escape from the display device through the radiation exit surface.

According to at least one embodiment of the display device, an optical element is arranged on the radiation exit surface on each pixel. For example, the pixels and the optical elements are unambiguously assigned to each other. For example, an optical element in plan view of the display device overlaps with only exactly one pixel of the display device.

An optical element is generally understood as an element, which influences the radiation characteristic of the radiation emitted by the display device, for example, with regard to the spatial and/or spectral radiation characteristic.

In at least one embodiment, the display device comprises a semiconductor layer sequence having an active region for generating radiation and forming a plurality of pixels, and having a carrier on which the semiconductor layer sequence is arranged. The carrier comprises a plurality of switches, each provided to control at least one pixel. An optical element is arranged on each pixel on a radiation exit surface of the semiconductor layer sequence facing away from the carrier.

The radiation characteristic of the assigned pixel can be influenced by means of the optical element assigned to each pixel.

According to at least one embodiment of the display device, the optical element is a lens. For example, the optical element is provided as a converging lens, such as a plano-convex lens.

In lateral direction, adjacent optical elements are spaced apart from each other.

According to at least one embodiment of the display device, a separating body is arranged in each case between two adjacent optical elements. The separating body is particularly impermeable to radiation emitted during operation of the display device.

"Radiation-impermeable" particularly means in this context that radiation incident perpendicularly on the element marked as radiation-impermeable does not pass through or does not pass through at more than 5% of the original intensity.

Exemplarily, the separating body is arranged in the form of a frame along an outer border of the pixels. Each optical element can be completely enclosed by a separating body in lateral direction.

The separating body may be reflective to the radiation produced by the active region, for example, with a reflectivity of at least 60%, or absorbent, for example, with an absorption of at least 60%. In case of doubt, the indicated reflectivities refer to a peak wavelength of the radiation emitted by the active region during operation.

According to at least one embodiment of the display device, the optical element and the separating body are coordinated with each other with respect to their material in such a way that the material of the separating body acts as a dewetting agent for the material of the optical element in the liquid state. The manufacturing of the optical elements between the separating bodies is simplified by the manufacturing of the display device. In particular, the dewetting effect can be used to locally control and limit the formation of the optical elements and thus their optical function, for example as a lens, for improved decoupling or for radiation conversion. Exemplarily, the separating body is hydrophilic or hydrophobic. For example, the separating body may have a fluorinated surface. Such a surface acts as a dewetting agent for a material of the optical element comprising a silicone or an epoxy.

According to at least one embodiment of the display device, the display device is free of a bonding layer causing a cohesive connection between the radiation exit surface and the optical element.

In the case of a cohesive connection the connecting partners, which are preferably prefabricated, are held together by means of atomic and/or molecular forces. A cohesive connection can be achieved, for example, by means of a connection means such as an adhesive or a solder. As a rule, disconnection of the connection is accompanied by destruction of the connection means and/or at least one of the connection partners.

In particular, during the manufacture of the display device, the optical elements are formed directly on the semiconductor layer sequence. The optical elements are therefore not prefabricated elements that are subsequently attached to the semiconductor layer sequence. A bonding layer is therefore not required.

Alternatively, the optical elements can be prefabricated, in particular in a composite, and subsequently attached to the display device.

According to at least one embodiment of the display device, the pixels on a side facing the carrier each have a connection area in which the pixels are electrically contacted, for example, by means of an electrically conductive layer arranged outside the semiconductor layer sequence. The charge carrier injection is therefore limited to the connection area.

In case of doubt, the region of the semiconductor layer of the semiconductor layer sequence which faces the carrier and is closest to it, and in which the semiconductor layer is adjacent to an electrically conductive layer, is regarded as the connection area, wherein charge carriers are injected into the active region via this electrically conductive layer during operation of the display device and can recombine there under emission of radiation. For example, the semiconductor layer sequence in the connection area is adjacent to a metal layer or a layer containing a transparent conductive oxide (TCO) material. Outside the connection area, however, no charge carrier is injected into this semiconductor layer.

According to at least one embodiment a surface of the connection area is at most 10% or at most 5% or at most 1% of a surface of the corresponding optical element. The connection area is small compared to the area of the corresponding optical element. This simplifies beam shaping, such as beam focusing using the optical element, which is provided as a converging lens, for example.

According to at least one embodiment of the display device, a radiation-impermeable material is arranged between adjacent pixels. Exemplarily, the side surfaces of the pixels are provided with a radiation-impermeable coating. The radiation-impermeable coating can also be in the form of a filling material that completely fills the interspaces between adjacent pixels.

Exemplarily, the radiation-impermeable coating has a reflectivity of at least 60% for the radiation emitted during operation of the display device. The radiation-impermeable coating comprises, for example, a metal layer and/or a dielectric mirror structure with a dielectric layer or with a plurality of dielectric layers.

According to at least one embodiment of the display device, the radiation-impermeable coating is electrically isolated from the pixels. Therefore, the radiation-impermeable coating does not serve to electrically contact the pixels and can itself be electrically conductive or electrically insulating.

In the case of an electrically conductive radiation-impermeable coating, it is advantageous to arrange an isolation layer between the side surface of the pixel and the radiation-impermeable coating, in particular at the level of the active region.

According to at least one embodiment of the display device, the pixels are electrically contacted by means of the radiation-impermeable coating. In particular, the semiconductor layer arranged on the side of the active region facing away from the carrier can be electrically contacted by means of the radiation-impermeable coating.

The radiation-impermeable coating can also cover the radiation exit surface of the pixels in places. In this case, the radiation-impermeable coating reduces the effective luminous area of the pixels. The dark trench between two adjacent pixels thus becomes more highly contrasted. Furthermore, the radiation-impermeable coating prevents, or at least greatly reduces, optical crosstalk between adjacent pixels.

The radiation-impermeable coating can be formed in particular on all side surfaces of the pixels.

According to at least one embodiment of the display device, a contact layer is arranged on the radiation exit surface of the pixels. Exemplarily the contact layer covers at least 5% of the area of the pixel in plan view of the display device. The contact layer can be formed in particular by means of the radiation-impermeable coating.

Alternatively or additionally, the separating body can be formed by means of the contact layer. For example, in addition to the function of electrical contacting, the contact layer can also serve as a separating body between adjacent pixels and/or as a radiation-impermeable coating between adjacent pixels on the side surfaces of the pixels.

Exemplarily at least two side surfaces of a pixel, e.g., two of four side surfaces in the case of a square pixel, are covered by the contact layer.

According to at least one embodiment of the display device, the semiconductor layer sequence between adjacent pixels is completely separated at least in places, in particular along the entire periphery of the pixels. This prevents or at least reduces the risk of optical crosstalk due to the propagation of radiation within a semiconductor material of the semiconductor layer sequence extending over adjacent pixels.

According to at least one embodiment of the display device, the optical elements are radiation conversion elements. The radiation conversion elements are configured to at least partially convert primary radiation generated in the active region into secondary radiation. The radiation emitted by adjacent radiation conversion elements can lie in the same spectral range, for example, in the yellow spectral range, or in different spectral ranges, in particular selected from the red, green and blue spectral ranges.

According to at least one embodiment of the display device, the display device has a carrier body arranged on the radiation exit surface. The carrier body extends over a plurality of pixels, whereby the radiation conversion elements are arranged in depressions of the carrier body. The carrier body thus constitutes a prefabricated composite element in which a plurality of optical elements are in the form of radiation conversion elements.

The depressions are configured to limit the lateral expansion of the respective radiation conversion elements. In the vertical direction the optical elements, especially in the form of radiation conversion elements, can lie completely within the carrier body or protrude in places beyond the carrier body.

The depressions in the carrier body and thus in the adjacent radiation conversion elements are advantageously spaced apart from each other in lateral direction. In particular, the depressions in the carrier body and the arrangement of the pixels of the display device are coordinated with one another in such a way that one depression overlaps exactly one pixel, respectively.

According to at least one embodiment of the display device, the carrier body between adjacent radiation conversion elements is radiation-impermeable. Exemplarily, the carrier body between adjacent radiation conversion elements has a radiation-impermeable material or the carrier body is coated with a radiation-impermeable material in these areas.

BRIEF DESCRIPTION OF THE DRAWINGS

Further embodiments and developments can be derived from the following description of the exemplary embodiments in connection with the figures.

In the figures:

FIG. 1A shows an exemplary embodiment of a display device in a schematic sectional view;

FIGS. 1B and 1C show exemplary embodiments of an electrical connection of the display device in schematic plan views; and FIGS. 2, 3, 4, 5, 6, 7 and 8 show exemplary embodiments of a display device.

Same, similar or seemingly similar elements are provided with the same reference signs in the figures.

Figure 3:
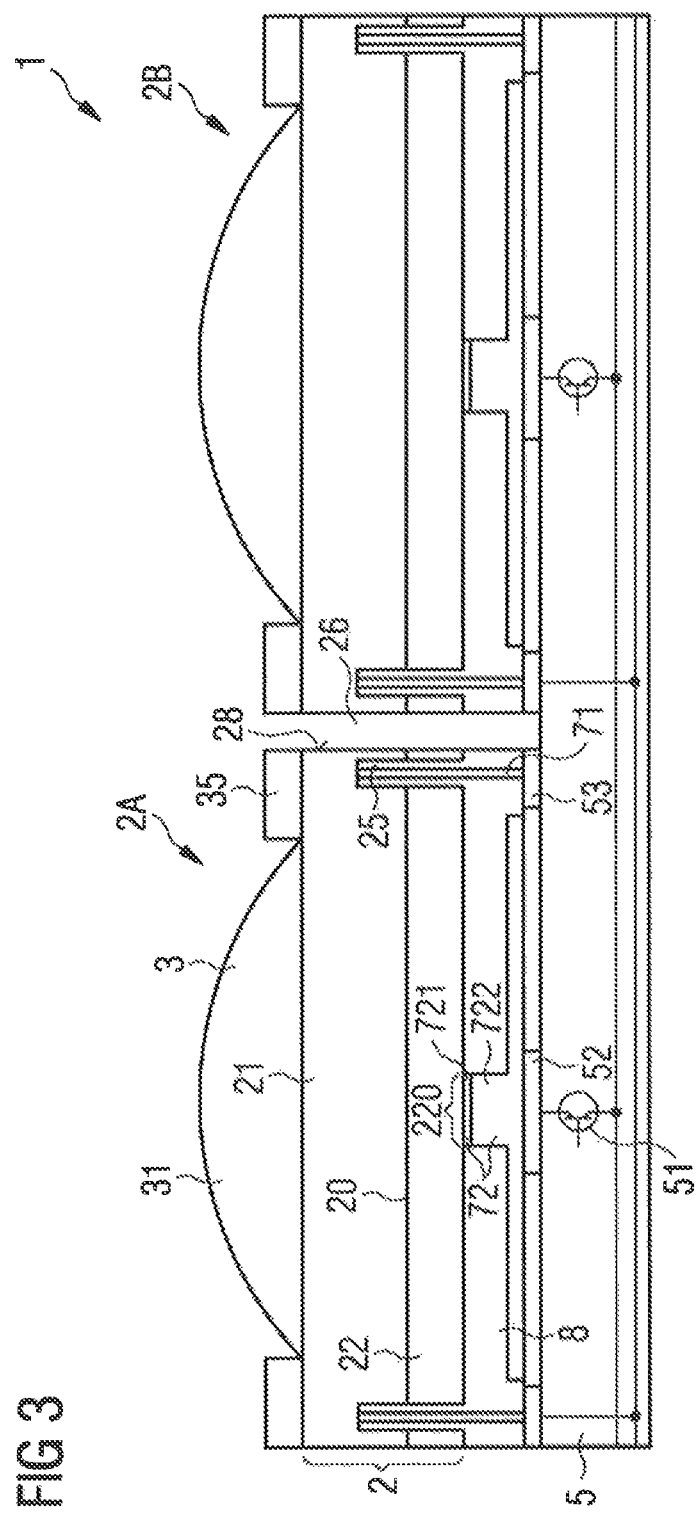

The figures are schematic representations and therefore not necessarily true to scale. Rather, comparatively small elements and, in particular, layer thicknesses can be displayed exaggeratedly large for clarification.

DETAILED DESCRIPTION OF ILLUSTRATIVE EMBODIMENTS

FIG. 1A shows an example of a display device 1. The display device 1 has a semiconductor layer sequence 2 with an active region 20 intended for the generation of radiation. The semiconductor layer sequence 2 is arranged on a carrier 5. The semiconductor layer sequence 2 forms a plurality of pixels. For a simplified representation only two pixels 2A, 2B are shown.

Each pixel can have a luminescent diode, such as an LED or a VCSEL.

The number of pixels can vary within wide limits depending on the application of the display device. For example, as a display device in an adaptive headlamp, the display device has between 2 and 50 pixels inclusive. To display moving or static images, the display device may also have more than 50, for example, 1000 pixels or more or 1,000,000 pixels or more.

The carrier 5 has a plurality of switches 51. The switches are each intended for the control of one pixel 2A, 2B.

An optical element 3 is arranged on each pixel 2A, 2B on a radiation exit surface 29 of the semiconductor layer sequence facing away from the carrier 5. The exemplary embodiment shows a lens 31 as an example of an optical element. For example, the lens is configured as a converging lens, such as a plano-convex lens. Radiation generated during operation of the display device in the active region 20 can be bundled by means of the optical element 3. A spatial separation of the radiation emitted by the individual pixels and, if necessary, further processing by a downstream optical system is thus simplified.

Furthermore, a separating body 35 is arranged on the radiation exit surface 29. The separating body 35 is radiation-impermeable to the radiation generated during operation in the active region 20. The separating body can be absorbent or reflective for the generated radiation. Exemplarily, the separating body covers between 5% inclusive and 50% inclusive of the area of a pixel. The separating body is, for example, a layer deposited on the semiconductor layer sequence. The separating body 35 reduces the effective area from which radiation can escape from the radiation exit surface 29 of the individual pixels 2A, 2B. In other words, the areas of two adjacent pixels from which radiation exits are further apart than the pixels themselves. A spatial separation between adjacent pixels 2A, 2B is thus simplified, even at small distances between the pixels.

In the lateral direction, a separating body 35 is arranged between two adjacent optical elements 3. In the exemplary embodiment shown, the separating bodies 35 between adjacent pixels 2A, 2B are spaced apart. However, the separating body 35 may also extend continuously over at least two adjacent pixels 2A, 2B.

In the lateral direction, the separating body 35 surrounds the optical element at least partially, in particular completely. The optical element 3 can be directly adjacent to the separating body 35. During the manufacturing of the display device 1, the optical element 3 can be formed directly on the radiation exit surface 29. The separating body 35 can be used as a boundary frame when applying the material for the optical element. Exemplarily, the separating body has a metal, such as aluminum or silver, and/or a dielectric material, such as an oxide such as silicon oxide or a nitride such as silicon nitride or titanium nitride. Alternatively, a polymer material can be used which is provided with filler particles to increase reflectivity or absorption.

Furthermore, the optical element 3 and the separating body 35 can be coordinated with each other with regard to their material in such a way that the material of the separating body has a dewetting effect on the material of the optical element in the liquid state. For example, the material of the separating body, or at least one surface of the separating body, is hydrophilic or hydrophobic. For example, the surface of the separating body is fluorinated and the optical element contains or consists of an epoxy or silicone.

In the case of an optical element formed directly on the radiation exit surface 29 of the semiconductor layer sequence 2, a bonding layer causing a cohesive connection between the semiconductor layer sequence and the optical element 3 is not required.

The semiconductor layer sequence 2 comprises a first semiconductor layer 21 and a second semiconductor layer 22, said semiconductor layers being disposed on opposite sides of the active region 20 and being of different conductivity types. For example, the first semiconductor layer 21 is n-conductive and the second semiconductor layer 22 is p-conductive or vice versa. The first semiconductor layer and the second semiconductor layer as well as the active region can also be multi-layered.

The first semiconductor layer 21 is arranged on the side of the active region 20 facing away from the carrier 5. The first semiconductor layer 21 is electrically conductively connected to a counter contact surface 53 of the carrier by means of a first contact layer 71.

The second semiconductor layer 22 is electrically conductively connected to a contact surface 52 of the carrier by means of a second contact layer 72.

In the example shown, the second semiconductor layers 22 of the pixels 2A, 2B are each connected to a switch 51, so that the individual pixels 2A, 2B can be controlled independently of each other via the second semiconductor layers 22. The first semiconductor layers 21 of adjacent pixels 2A, 2B or all pixels of the display device 1 can be electrically connected to each other and can be on the same potential during operation of display device 1. Of course, the first semiconductor layers 21 can also be electrically conductively connected to a switch and the second semiconductor layers of adjacent pixels can be on the same electrical potential.

The semiconductor layer sequence 2 has at least one recess 25 for each pixel. The recess 25 extends through the second semiconductor layer 22 and the active region 20 into the first semiconductor layer 21. In the recess, the first contact layer 71 is electrically conductively connected to the first semiconductor layer 21. The second semiconductor layer 22 is electrically conductively connected to the second contact layer 72 in a connection area 220. The second contact layer can be multi-layered and can, for example, have a connection layer 721 adjacent to the second semiconductor layer 22 and a mirror layer 722. Exemplarily, the connection layer has a TCO material, such as ITO or ZnO. The mirror layer can contain a material such as aluminum, silver, rhodium or nickel. The materials mentioned are characterized by a high reflectivity in the visible spectral range. Gold, for example, is suitable for radiation in the infrared spectral range.

An isolation layer 8 is arranged between the second semiconductor layer 22 and the carrier 5. The isolation layer 8 is especially configured as a dielectric mirror structure. For example, isolation layer 8 has a plurality of dielectric layers, with adjacent layers differing in their refractive indices.

Radiation emitted in the direction of the carrier 5 can be reflected at the isolation layer 8 and/or the mirror layer 722 and subsequently emerge from the radiation exit surface 29.

Adjacent pixels 2A, 2B are separated by interspaces 26. The interspaces 26 extend in a vertical direction, i.e., perpendicular to a main extension plane of the carrier 5, completely through the semiconductor layer sequence 2.

The danger of an optical path within the semiconductor layer sequence 2 between adjacent pixels is avoided. Optical crosstalk between adjacent pixels is further reduced.

The optical element 3 preferably has a refractive index of at least 1.5. The higher the refractive index, the better the optical coupling between the optical element 3 and the semiconductor layer sequence 2. For example, the optical element contains a polymer material such as a silicone or an epoxy or an oxide such as titanium oxide or silicon oxide. To increase the refractive index, the material of the optical element 3 can be filled with filling particles, for example, GaP particles.

During the manufacturing of the display device 1, the pixels 2A, 2B are derived from a common semiconductor layer sequence 2. Therefore, pixels do not differ from each other with regard to the material composition and the structural composition of the semiconductor layers, apart from minor production-related fluctuations in epitaxial deposition. The production of the pixels of the display device can thus be carried out in a combined manner.

The semiconductor layer sequence 2, in particular the active region 20, comprises a III-V compound semiconductor material.

III-V compound semiconductor materials are particularly suitable for radiation generation in the ultraviolet ($Al_xIn_yGa_{1-x-y}N$), visible ($Al_xIn_yGa_{1-x-y}N$, especially for blue to green radiation, or $Al_xIn_yGa_{1-x-y}P$, especially for yellow to red radiation) and infrared ($Al_xIn_yGa_{1-x-y}As$) spectral ranges; where $0 \le x \le 1$, $0 \le y \le 1$ and $x+y \le 1$, in particular with $x \ne 1$, $y \ne 1$, $x \ne 0$ and/or $y \ne 0$. III-V compound semiconductor materials, in particular from the material systems mentioned, can continue to achieve high internal quantum efficiencies in radiation generation.

FIGS. 1B and 1C show exemplary embodiments of the electrical contacting of the first semiconductor layer 21 in top view of the display device 1. For a simplified representation, the areas in which the first contact layer 21 electrically contacts the first semiconductor layer 21 are shown for four pixels 2A, 2B only.

In the example shown in FIG. 1B, the first contact layer 71 runs in the form of a frame. In plan view of the display device, the electrical contact forms a closed path by means of the first contact layer 71. This simplifies a laterally uniform current injection during operation of the display device.

Alternatively, the first contact layer 71, as shown in FIG. 1C, can also electrically contact the semiconductor layer sequence, in particular the first semiconductor layer, selectively only. According to the example shown in FIG. 1C, the electrical contact is exemplarily made in the corners of the pixels 2A, 2B. However, the arrangement of the points where the first contact layer 71 electrically contacts the semiconductor layer sequence 2 can be varied within wide limits. For example, electrical contacting can take place at only one corner or at two, especially opposite, corners.

The exemplary embodiment shown in FIG. 2 essentially corresponds to the exemplary embodiment described in connection with FIG. 1. The difference is that the connection area 220 is small compared to the lateral expansion of the optical element 3. Exemplarily, a surface of the connection area 220 in plan view of the display device is at most 10%, in particular at most 5% or at most 1% of the surface of the corresponding optical element 3. The electrical contacting of the second semiconductor layer 22 and thus also the radiation generation in the active region 20 is thus specifically limited to an area which is significantly smaller than the lateral expansion of the active region 20 of a pixel 2A, 2B.

The connection area 220 overlaps in particular with an optical axis 30 of the optical element 3. The proportion of radiation generated in the immediate vicinity of the optical axis 30 in the active region 20 is thus increased. This simplifies beam shaping, in particular the beam bundling of the radiated radiation by means of the optical element 3, which is configured as a lens 31.

Such a comparatively small connection area 220 is also suitable for the other exemplary embodiments, even if it is not explicitly shown as such or is omitted in the figures.

The exemplary embodiment shown in FIG. 3 essentially corresponds to the exemplary embodiment described in connection with FIG. 2 with the difference that the second contact layer 72 has a larger lateral expansion than the connection area 220. The mirror layer 722 partially covers the isolation layer 8 in places. Seen vertically, the isolation layer 8 and the second contact layer 72 overlap, especially the mirror layer 722 of the second contact layer 72. Radiation not reflected at the isolation layer 8 and passing through the isolation layer can be reflected at the mirror layer 722. Despite the comparatively large lateral expansion of the second contact layer, the connection area 220, in which the second semiconductor layer 22 is actually electrically contacted, is small compared to the lateral expansion of the optical element 3, as described in FIG. 2.

The exemplary embodiment shown in FIG. 4 essentially corresponds to the exemplary embodiment described in connection with FIG. 1.

Figure 4:
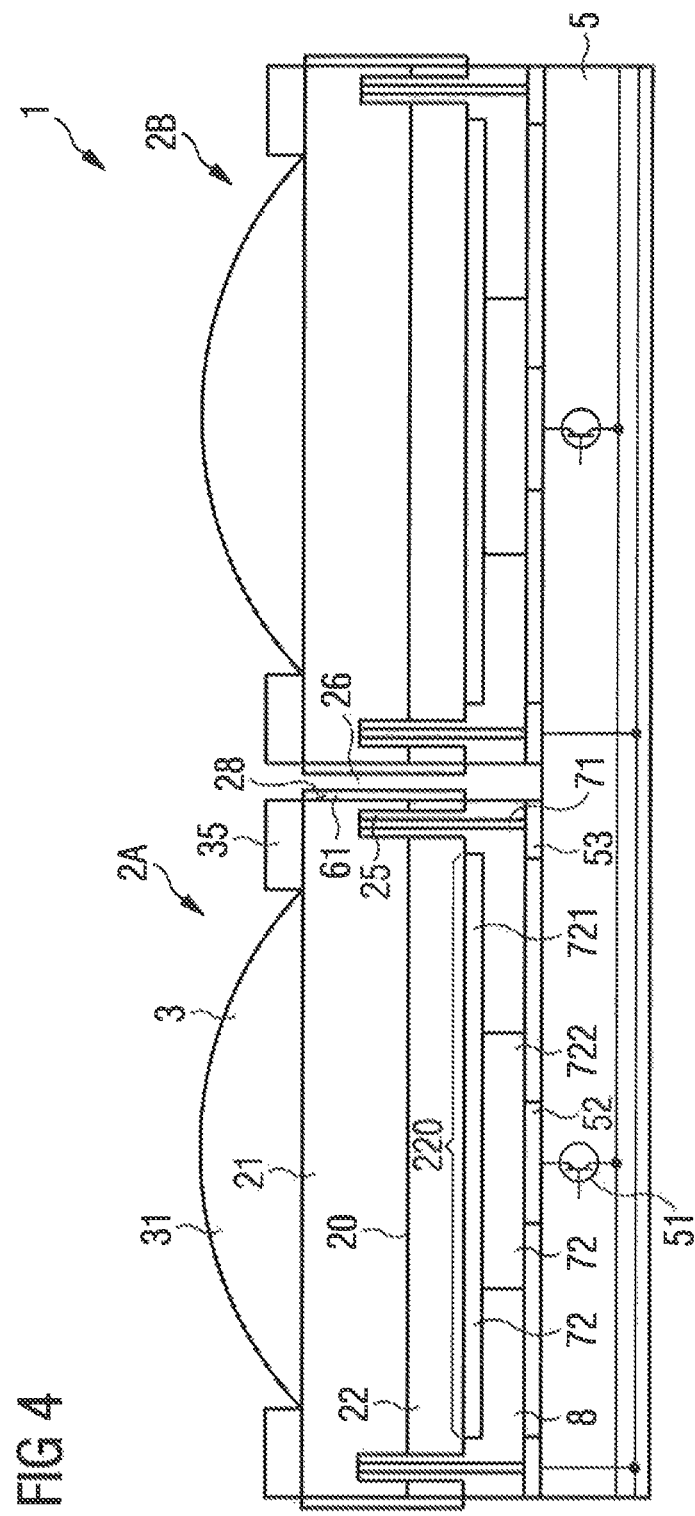

The exemplary embodiment of FIG. 4 differs from the exemplary embodiment of FIG. 1 in that the side surfaces 28 of the pixels 2A, 2B are provided with a radiation-impermeable coating 61. The radiation-impermeable coating 61 is electrically insulating at least in the area adjacent to the side surface 28 of the pixels 2A, 2B.

The radiation-impermeable coating 61 further reduces optical crosstalk between adjacent pixels 2A, 2B. The radiation-impermeable coating 61 can be configured to absorb or reflect the radiation generated in the active region 20. Exemplarily, the radiation-impermeable coating 61 has a reflectivity of at least 60% or 80%.

Exemplarily, the radiation-impermeable coating 61 has a dielectric mirror structure and/or a metal layer. By combining a dielectric mirror structure with a metal layer, high reflectivities can be achieved, especially over an angle of incidence range that is large compared to a dielectric mirror structure. The side surfaces 28 of the pixels 2A, 2B can thus be mirrored without necessarily creating an electrical path. The materials mentioned in connection with isolation layer 8 or mirror layer 722 are particularly suitable as materials. The radiation-impermeable coatings 61 of adjacent pixels 2A, 2B are laterally spaced from each other. However, deviating from this, the interspaces 26 can also be completely filled with the radiation-impermeable coating.

The exemplary embodiment shown in FIG. 5 essentially corresponds to the exemplary embodiment described in connection with FIG. 4 with the difference that the first contact layer 71 for electrically contacting the first semiconductor layer 21 covers the radiation exit surface 29 in places. For example, the first contact layer covers at least 5% of the area of a pixel 2A, 2B. The first contact layer is led over at least one or all side surfaces 28 of the pixels 2A, 2B. Preferably, the first contact layer is formed in such a way that it reflects incident radiation back into the semiconductor layer sequence.

The first contact layer 71 can fulfil not only the function of the electrical contacting of the first semiconductor layer 21, but also the function of the separating body 35 and the radiation-impermeable coating 61. The first contact layer 71, for example, is metallic. To avoid an electrical short circuit of the active region 20, a further isolation layer 85 is arranged between the side surfaces 28 of the pixels 2A, 2B and the first contact layer 71.

The separating body 35 formed by the first contact layer 71 extends over two adjacent pixels 2A, 2B. Exemplarily, in plan view of the display device, the first contact layer 71 runs over the display device in the form of a grid, whereby there is an optical element 3 of a pixel in each of the openings of the grid.

The formation of recesses 25 running within the pixels through the second semiconductor layer 22 and the active region 20 is not necessary for the electrical contacting of the first semiconductor layer 21 in this exemplary embodiment. Such an electrical contacting of the first semiconductor layer is also suitable for the other exemplary embodiments described.

The exemplary embodiment shown in FIG. 6 essentially corresponds to the exemplary embodiment described in connection with FIG. 5.

The exemplary embodiment of FIG. 6 differs from the previous exemplary embodiment in that the first contact layer 71 does not run in the interspaces 26 between adjacent pixels. Exemplarily, an electrical connection between the first contact layer 71 and the counter contact surface 53 of carrier 5 is made only in one edge area of display device 1. The interspaces between adjacent pixels 2A, 2B can optionally be completely or at least partially filled with a radiation-impermeable coating 61.

FIG. 7 shows another example of a display device. This exemplary embodiment differs from the previous exemplary embodiment in particular in that the optical element 3 is configured as a radiation conversion element 32. The radiation conversion element 32 is intended to convert primary radiation generated in the active region 20 of the pixels 2A, 2B at least partially into secondary radiation, whereby a peak wavelength of the secondary radiation differs from the peak wavelength of the primary radiation. For example, the radiation conversion element 32 is intended for the partial conversion of radiation in the blue spectral range, so that for the human eye the color mixture of the primary radiation and the secondary radiation results in light that appears white.

Neighboring radiation conversion elements 32 may also be different to each other with respect to the secondary radiation to be generated. For example, the radiation conversion elements can each have a fluorescent material that emits in a spectral range selected from the red, green and blue spectral ranges.

The display device 1 has a carrier body 39. The carrier body 39 extends over several pixels 2A, 2B, in particular over all pixels of the display device. The carrier body 39 has depressions 390 in which the radiation conversion elements 32 are arranged. For the manufacture of the display device 1 the carrier body 39, that is already provided with the radiation conversion elements 32, can be attached to the radiation exit surface 29 of the semiconductor layer sequence, e.g., by means of a radiation-permeable bonding layer 9.

At least in the region between the radiation conversion elements 32 and the pixels 2A, 2B, the carrier body 39 is transparent or at least translucent for the radiation generated in the active region 20, approximately with a transmission of at least 80%. Exemplarily, the carrier body contains a glass or a transparent plastic.

Further details of the display device 1, in particular the semiconductor layer sequence 2, the carrier 5 and the type of electrical contacting of the individual pixels 2A, 2B, are not explicitly shown in FIG. 7 and can be configured as described in the previous exemplary embodiments.

The exemplary embodiment shown in FIG. 8 essentially corresponds to the exemplary embodiment described in connection with FIG. 7.

The exemplary embodiment of FIG. 8 differs from the previous exemplary embodiment in that the carrier body 39 is radiation-impermeable in places. For this purpose, the carrier body 39 has a radiation-impermeable coating 395 between adjacent depressions 390. By means of this coating 395 a separating body 35 is formed between adjacent optical elements 3, as described in FIG. 1A. Instead of a coating 395, the carrier body 39 can also be formed in places from a radiation-impermeable material, especially in the area between adjacent depressions 390.

The display devices described herein are characterized by a good optical contrast between the pixels 2A, 2B and the interspaces 26 between the pixels and also by a low optical crosstalk even with pixels that are comparatively close to each other, at a distance of at most 5 µm. By reducing the lateral expansion of the pixels and the distances between the pixels, a higher resolution of the display device can be achieved without loss of contrast. Furthermore, a higher efficiency can be achieved in radiation generation and the intensity of the radiation emitted from the area effectively used for radiation decoupling can be increased.

The invention is not limited by the description of the exemplary embodiments. Rather, the invention includes any new feature and any combination of features, which in particular includes any combination of features in the patent claims, even if that feature or combination itself is not explicitly mentioned in the patent claims or the exemplary embodiments.

The invention claimed is:

1. A display device comprising:
   a carrier comprising a plurality of switches;
   a semiconductor layer sequence arranged on the carrier, the semiconductor layer sequence comprising an active region configured to generate primary radiation and forming a plurality of pixels, wherein each switch is configured to control at least one pixel;
   an optical element arranged on each pixel on a radiation exit surface of the semiconductor layer sequence facing away from the carrier; and
   separating bodies on a top side of each pixel in direct contact with the pixel, wherein the separating bodies are impermeable to radiation emitted during operation of the display device, each separating body completely surrounding the optical element in a lateral direction, and wherein the top side of each pixel is free of the separating body in places where the pixel is covered by the optical element.

2. The display device according to claim 1, wherein the optical element is a lens.

3. The display device according to claim 1, wherein each pixel, on a side facing the carrier, has a connection area in which the pixels are electrically contacted, and wherein, in plan view of the display device, a surface of the connection area is at most 10% of a surface of the corresponding optical element.

4. The display device according to claim 1, further comprising a wherein each separating body is arranged between two adjacent optical elements.

5. The display device according to claim 4, wherein the optical element and the separating body are adapted to each another with respect to their materials in such a way that a material of the separating body acts as a dewetting agent for a material of the optical element in a liquid state.

6. The display device according to claim 1, wherein the display device is free of a bonding layer causing a cohesive connection between the radiation exit surface and the optical element.

7. The display device according to claim 1, wherein side surfaces of the pixels comprises a radiation-impermeable coating.

8. The display device according to claim 7, wherein the radiation-impermeable coating has a reflectivity of at least 60% for the radiation emitted during operation of the display device.

9. The display device according to claim 7, wherein the radiation-impermeable coating is electrically isolated from the pixels.

10. The display device according to claim 7, wherein the pixels are electrically contacted by the radiation-impermeable coating.

11. The display device according to claim 1, further comprising a first contact layer arranged on the radiation exit surface of the pixels.

12. The display device according to claim 1, wherein the semiconductor layer sequence between adjacent pixels is completely separated.

13. The display device according to claim 1, wherein the optical element is a radiation conversion element configured to at least partially convert the primary radiation into secondary radiation.

14. The display device according to claim 13, further comprising a carrier body arranged on the radiation exit surface, wherein the carrier body extends over a plurality of pixels, and wherein each radiation conversion element is arranged in depressions of the carrier body.

15. The display device according to claim 14, wherein the carrier body between adjacent radiation conversion elements is radiation-impermeable.

16. A display device comprising:
   a carrier comprising a plurality of switches;
   a semiconductor layer sequence arranged on the carrier, the semiconductor layer sequence comprising an active region configured to generate radiation and forming a plurality of pixels, wherein each switch is configured to control at least one pixel;
   an optical element arranged on each pixel on a radiation exit surface of the semiconductor layer sequence facing away from the carrier;
   side surfaces of the pixels comprise a radiation-impermeable coating; and
   separating bodies on a top side of each pixel in direct contact with the pixel, wherein the separating bodies are impermeable to radiation emitted during operation of the display device, each separating body completely surrounding the optical element in a lateral direction, wherein the top side of each pixel is free of the separating body in places where the pixel is covered by the optical element.

17. A display device comprising:
   a carrier comprising a plurality of switches;
   a semiconductor layer sequence arranged on the carrier, the semiconductor layer sequence comprising an active region configured to generate radiation and forming a plurality of pixels, wherein each switch configured to control at least one pixel; and
   an optical element arranged on each pixel on a radiation exit surface of the semiconductor layer sequence facing away from the carrier, wherein each pixel on a side facing the carrier has a connection area in which the pixel is electrically contacted, and wherein, in plan view of the display device, a surface area of the connection area is at most 10% of a surface area of the corresponding optical element.

18. The display device according to claim 16, wherein the optical element is a lens.

* * * * *

UNITED STATES PATENT AND TRADEMARK OFFICE
CERTIFICATE OF CORRECTION

PATENT NO. : 10,770,442 B2
APPLICATION NO. : 16/475648
DATED : September 8, 2020
INVENTOR(S) : Lorenzo Zini et al.

Page 1 of 1

It is certified that error appears in the above-identified patent and that said Letters Patent is hereby corrected as shown below:

In the Claims

In Column 11, Lines 62-63, Claim 4, delete "further comprising a".

Signed and Sealed this
Third Day of November, 2020

Andrei Iancu
*Director of the United States Patent and Trademark Office*